(12) United States Patent
Kataoka et al.

(10) Patent No.: US 9,705,496 B2
(45) Date of Patent: Jul. 11, 2017

(54) SWITCH DEVICE

(71) Applicant: Valeo Japan Co., Ltd., Saitama (JP)

(72) Inventors: Hiromasa Kataoka, Tokyo (JP); Kenji Amimoto, Tokyo (JP); Shuei Tamura, Tokyo (JP)

(73) Assignee: Valeo Japan Co., Ltd. (JP)

( * ) Notice: Subject to any disclaimer, the term of this patent is extended or adjusted under 35 U.S.C. 154(b) by 0 days.

(21) Appl. No.: 14/757,795

(22) Filed: Dec. 23, 2015

(65) Prior Publication Data

US 2016/0191056 A1 Jun. 30, 2016

(30) Foreign Application Priority Data

Dec. 24, 2014 (JP) ................................. 2014-260796

(51) Int. Cl.
*H03K 17/96* (2006.01)
*G06F 3/041* (2006.01)
*G06F 3/044* (2006.01)

(52) U.S. Cl.
CPC ......... *H03K 17/9622* (2013.01); *G06F 3/044* (2013.01); *G06F 3/0416* (2013.01); *G06F 2203/04112* (2013.01)

(58) Field of Classification Search
None
See application file for complete search history.

(56) References Cited

U.S. PATENT DOCUMENTS

2013/0194230 A1* 8/2013 Kawaguchi ........... G06F 3/0416
345/174

FOREIGN PATENT DOCUMENTS

JP 2007-317393 A 12/2007

OTHER PUBLICATIONS

European Search Report for EP15197385.
English abstrct for JP-2007-317393.

* cited by examiner

*Primary Examiner* — Kenneth B Lee, Jr.
(74) *Attorney, Agent, or Firm* — Fishman Stewrt PLLC

(57) ABSTRACT

A switch device may include a non-conductive operating portion provided with a plurality of operating areas inside an outer edge part of the operating portion, an electrode sheet spaced from the operating portion and having a plurality of electrodes each including at least one detection electrode and being arranged to face a respective operating area, and a detecting unit that may detect operations of the plurality of operating areas. An inner part of the operating portion positioned inward of the outer edge part may be displaceable in a facing direction of the operating areas and the electrodes. The detecting unit may be configured to determine an operated operating area, which may be operable by touch or push operation, based upon a position of at least one of the detection electrodes, a change in capacitance of the detection electrode, and a changing amount in capacitance of the detection electrode.

3 Claims, 6 Drawing Sheets

SWITCH DEVICE

CROSS-REFERENCE TO RELATED APPLICATIONS

This application claims priority to Japanese Patent Application No. 2014-260796 filed on Dec. 24, 2014, the disclosure of which is incorporated by reference herein in its entirety.

TECHNICAL FIELD

The present invention relates to a structure of a switch device.

BACKGROUND

Japanese Patent Laid-Open Publication No. 2007-317393 discloses a switch device configured by a combination of a capacitance type touch switch and a mechanical type push button switch.

The switch device disclosed in Japanese Patent Laid-Open Publication No. 2007-317393 is structured such that a touch operation performed on an operating surface by an operator is detected by the capacitance type touch switch and a push operation performed on the operating surface is detected by the mechanical type push button switch.

The aforementioned switch device is provided with two types of switches for detecting both the touch operation and the push operation, and particularly since the push button switch is provided with a mechanism for connecting and disconnecting contact points, costs for manufacturing the switch device increase.

Therefore there is a demand for a switch device in which both the touch operation and the push operation can be detected by the operation of the capacitance type touch switch alone.

SUMMARY

Accordingly, the present invention is made in view of the above-described problem, and an object of the present invention is to provide a switch device which can detect both a touch operation and a push operation by an operation of a capacitance type touch switch alone, leading to less manufacturing costs thereof.

According to the present invention, there is provided a switch device comprising:
  a non-conductive operating portion provided with a plurality of operating areas inside an outer edge part of the operating portion;
  an electrode sheet that is provided to be spaced from the operating portion and has a plurality of electrodes arranged to face the respective operating areas on a one-on-one relationship; and
  a detecting unit that detects operations to the plurality of operating areas, wherein
  an inner part of the operating portion positioned inward of the outer edge part is displaceable in the facing direction of the operating area and the electrode, and
  the detecting unit is configured to determine an operated operating area and by which any form of a touch operation and a push operation the operating area is operated, based upon a position of the electrode a capacitance of which has changed and a changing amount in capacitance of the electrode the capacitance of which has changed.

According to the present invention, in the operating portion the inner part of the operating portion positioned inward of the outer edge part of the operating portion and provided therein with the plurality of operating areas, is displaceable in the facing direction of the operating area and the electrode. Therefore when the touch operation is performed on the operating area, an interval between the operated operating area and the electrode arranged to face the operated operating area does not change, but when the push operation is performed thereon, the operating area having been subjected to the push operation is displaced to the electrode side to change in a direction of narrowing the interval to the electrode.

Then, in any case of a case where the touch operation is performed on the operating area and a case where the push operation is performed thereon, the capacitance in the electrode arranged to face the operated operating area changes, but a changing amount in capacitance thereof when the push operation is performed is larger than a changing amount in capacitance thereof when the touch operation is performed.

Accordingly, the detecting unit can determine the operated operating area and by which one of the touch operation and the push operation the operated operating area is performed, based upon the position of the electrode the capacitance of which has changed and the changing amount in capacitance of the electrode the capacitance of which has changed. Therefore the switch device in the present invention can detect both the touch operation and the push operation.

BRIEF DESCRIPTION OF THE DRAWINGS

Other objects, features, and advantages of the present invention will become more apparent from the following detailed description made with reference to the accompanying drawings, in which like parts are designated by like reference numbers and in which.

DETAILED DESCRIPTION

Hereinafter, a switch device according to an embodiment in the present invention will be in detail explained by taking a case of being applied to a switch device 1 that is incorporated in a steering wheel for a vehicle and is used for an operation of an in-vehicle instrument for a vehicle (for example, an air conditioner or an audio device), as an example.

Figure 1:
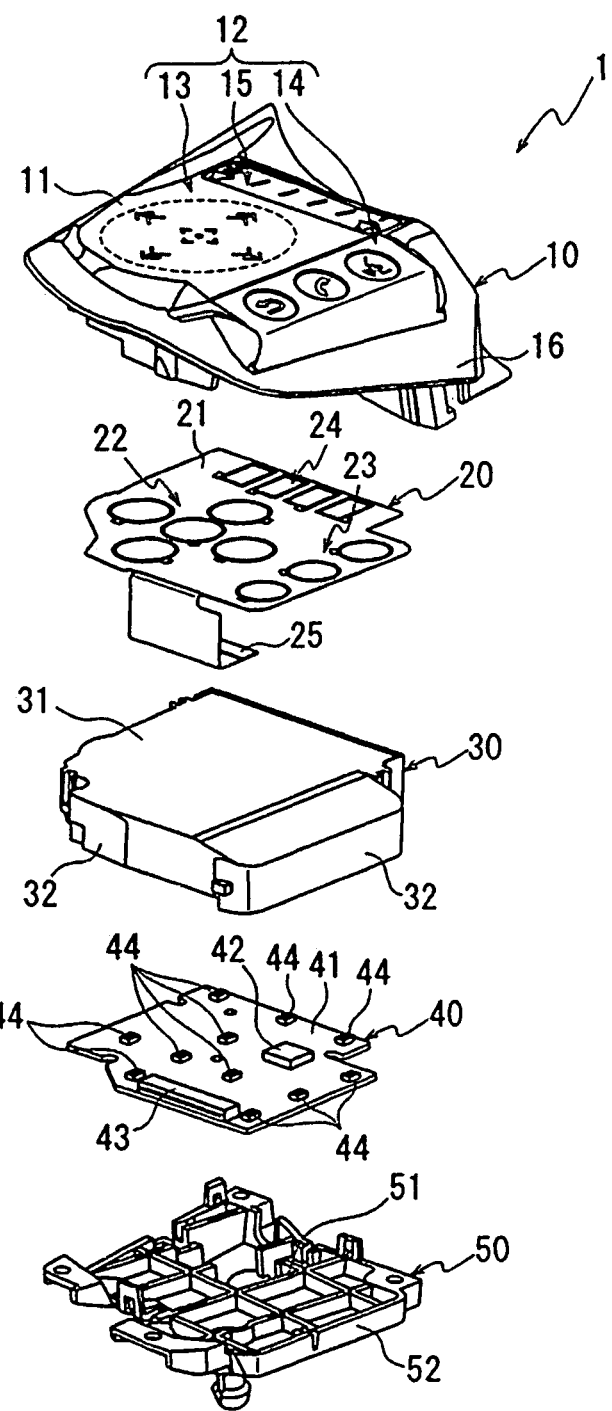
FIG. 1 is an exploded perspective view illustrating a switch device according to an embodiment.

FIG. 1 is an exploded perspective view illustrating a switch device 1 according to an embodiment of the present invention.

Figure 2A:
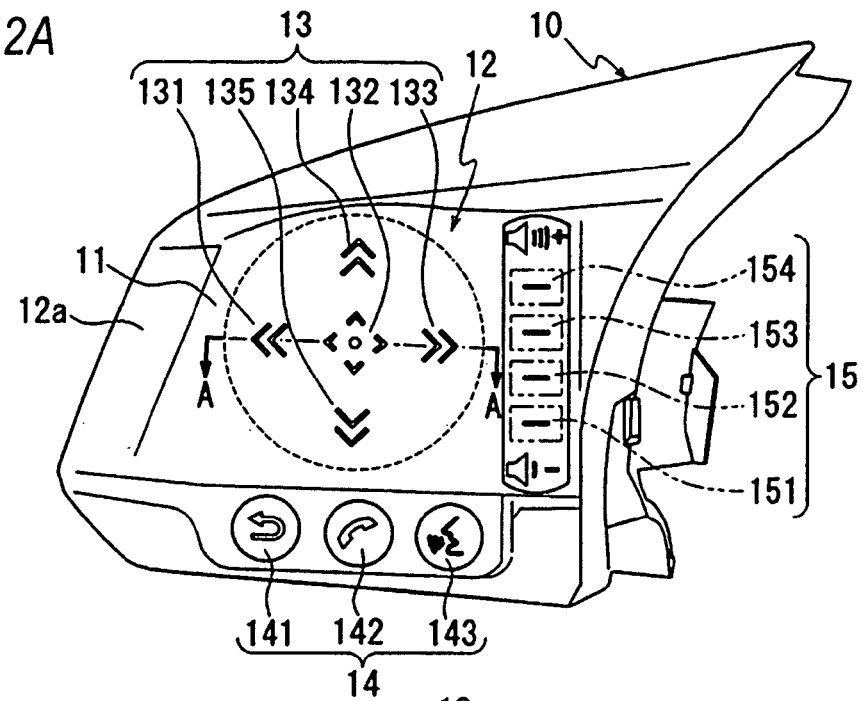
FIGS. 2A to 2C are views explaining an upper cover and a film electrode according to the embodiment.
Figure 2B:
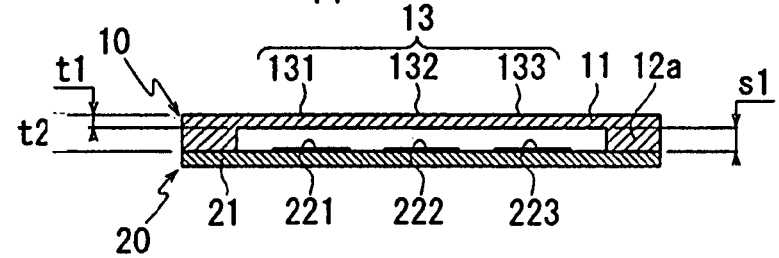
Figure 2C:
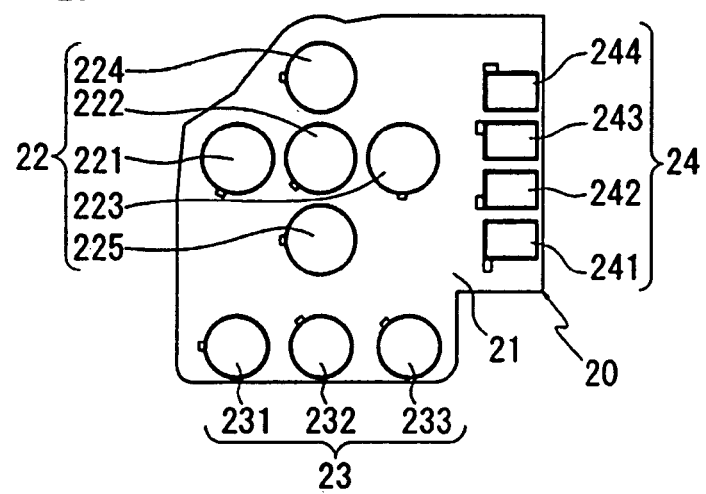

FIGS. 2A to 2C are views explaining an upper cover 10 and a film electrode 20, wherein FIG. 2A is a plan view of the upper cover 10 and a diagram explaining a direction of the upper cover 10 in a state where the switch device 1 is mounted on a steering wheel, FIG. 2B is an enlarged sectional view taken in a direction of arrows A-A in FIG. 2A, and FIG. 2C is a plan view illustrating the film electrode 20.

It should be noted that in the following explanation, for descriptive purposes, "upper cover 10-side" is explained as "upper side", and "lower cover 50-side" is explained as "lower side" in FIG. 1.

Further, in FIG. 2A, "operating button 134-side" is explained as "upper side", "operating steering wheel 135-side" is explained as "lower side", "operating steering wheel 131-side" is explained as "left side", and "operating steering wheel 133-side" is explained as "right side".

As illustrated in FIG. 1, the switch device 1 comprises an upper cover 10 having an operating portion 12, a film electrode 20 having a plurality of electrodes 22, 23, 24, a base 30 on which the film electrode 20 is placed, a substrate 40 having a control unit 42 (central processing unit) for performing an entire control of the switch device 1, and a lower cover 50 that is fitted in the upper cover 10.

The upper cover 10 and the lower cover 50 are structured to be fitted with each other in an upper-lower direction in a state where the film electrode 20, the base 30 and the substrate 40 are accommodated therein.

The upper cover 10 includes an upper wall 11 and a peripheral wall 16 surrounding a peripheral edge of the upper wall 11, and is formed of a non-conductive synthetic resin material.

The upper wall 11 is provided with the operating portion 12 on which operations (a touch operation, a push operation and a slide operation) are performed by an unillustrated user, and the film electrode 20 placed on the base 30 is disposed downward to the base 30-side of the operating portion 12 to be spaced from the operating portion 12.

The operating portion 12 is provided with operating areas 13, 14, 15 to each of which any function is allotted, and the thickness of the upper wall 11 in the region (the operating portion 12) where the operating areas 13, 14, 15 are disposed is thinner than the thickness of an outer edge part 12a (refer to FIG. 2B) in the region (the operating portion 12) where the operating areas 13, 14, 15 are disposed.

Therefore the region (the operating portion 12) where the operating areas 13, 14, 15 are disposed is displaceable in the facing direction of the operating portion 12 and the film electrode 20. When any of the operating areas 13, 14, 15 is pushed downward (operated to be pushed) to the film electrode 20-side by a user, the pushed operating area and the peripheral area are displaced to the film electrode 20-side.

As illustrated in FIG. 2A, the operating area 13 is a circular-shaped area that is set in an approximately central part of the operating portion 12 in plan view (in the figure, refer to a dotted line), and in the operating area 13, five operating buttons 131 to 135 are provided to be adjacent to each other.

The operating buttons 131, 132, 133 are arranged in one line in the left-right direction in plan view, and the operating buttons 134, 135 are disposed in the upper-lower direction about the operating button 132 positioned in the middle of the three operating buttons. Therefore the three operating buttons 134, 132, 135 are arranged in one line in the left-right direction in plan view.

Patterns of "left arrow", "right arrow", "upper arrow", and "lower arrow" are drawn on surfaces of the operating buttons 131, 133, 134, 135 respectively, and a pattern for "quadrangle" is drawn on a surface of the operating button 132. The patterns of "left arrow", "right arrow", "upper arrow", "lower arrow" and "quadrangle" are drawn to express functions allotted to the respective operating buttons. In a case where the touch operation is performed on the operation buttons 131 to 135 each, a function of "left transfer", "right transfer", "upper transfer", "lower transfer" or "determination" of a cursor displayed on an unillustrated display device is performed. In a case where the push operation is performed on the operation buttons 131 to 135 each, the function of "the determination" is performed regardless of the above functions.

As illustrated in FIG. 2A, the operating area 14 is arranged downward of the operating area 13, and three operating buttons 141, 142, 143 are arranged in one line in the left-right direction in plan view.

Patterns for expressing functions allotted to the operating buttons 141, 142, 143 respectively, specifically "U-shaped arrow (back)", "telephone" and "hands-free" are drawn on surfaces of the operating buttons 141, 142, 143 respectively.

In addition, the operating area 15 is arranged on the right side of the operating area 13, and four operating buttons 151, 152, 153, 154 are arranged in one line in the left-right direction in plan view.

A pattern of "-" is drawn on each surface of the operating buttons 151 to 154, and a pattern of an image for lowering the volume is drawn on a lower end of the pattern and a pattern of an image for turning up the volume is drawn on an upper end of the pattern. Therefore it is predicted that the volume gradually turns up by operations of the operating buttons 151 to 154 in order from the lower side to the upper side.

The film electrode 20 placed on the base 30 is provided downward to the base 30-side of each of the operating areas 13, 14, 15 to be spaced from the operating portion 12.

The film electrode 20 is formed of flexible printed circuits (FPC), and has a base film 21 and a terminal portion 25 extending from one end of the base film 21 to the substrate 40 arranged downward of the base 30 (refer to FIG. 1).

Transparent or translucent electrodes 22, 23, 24 are placed on a surface of the base film 21 in the upper cover 10-side.

The electrode 22 positioned downward of the operating area 13 includes detection electrodes 221 to 225 corresponding to the respective operating buttons 131 to 135 of the operating area 13, the electrode 23 positioned downward of the operating area 14 includes detection electrodes 231 to 233 corresponding to the respective operating buttons 141 to 143 of the operating area 14, and the electrode 24 positioned downward of the operating area 15 includes detection electrodes 241 to 244 corresponding to the respective operating buttons 151 to 154 of the operating area 15.

The detection electrodes 221 to 225, 231 to 233, 241 to 244 respectively are arranged to face the aforementioned operating buttons 131 to 135, 141 to 143, 151 to 154 respectively on a one-on-one relationship, and a predetermined interval s1 between the detection electrode and the operating button arranged to face it is formed (refer to FIG. 2B).

The interval s1 in the push direction of the operating button between each detection electrode and each operating button is set as an interval to the extent that the operating button displaced to the film electrode 20-side does not make contact with the corresponding detection electrode when the push operation is performed on the operating button.

The terminal portion 25 is connected to each of the detection electrodes 221 to 225, 231 to 233, 241 to 244 (refer to FIG. 1), and when the terminal portion 25 is connected to a connector 43 of the substrate 40 to be described later, each of the detection electrodes 221 to 225, 231 to 233, 241 to 244 is connected to the control unit 42 of the substrate 40.

The base 30 on which the film electrode 20 is placed includes a support portion 31 for supporting a surface of the film electrode 20 at the opposite to the upper cover 10 and a peripheral wall portion 32 surrounding a peripheral edge of the support portion 31.

The base 30 is formed in a bottomed, tubular shape to open downward in the lower cover 50-side, and is provided to fit the peripheral wall portion 32 on an outer periphery of the substrate 40 fixed on an upper surface of the lower cover 50.

The base 30 is formed of a transparent synthetic resin (for example, acrylic resin) material.

As illustrated in FIG. 1, the substrate 40 includes a base 41, the control unit 42 for performing the entire control of the switch device 1, the connector 43 which the terminal portion 25 of the film electrode 20 is inserted in or pulled out of, and a plurality of LEDs 44.

The control unit 42, the connector 43 and the LEDs 44 are mounted on the surface of the base 41.

The terminal portion 25 of the film electrode 20 is inserted in the connector 43 to establish connection for the electrodes 22 to 24 of the film electrode 20 to the control unit 42.

The plurality of LEDs 44 are arranged in a position of overlapping with the operating buttons 131 to 135, 141 to 143, 151 to 154 of the upper cover 10 and the detection electrodes 221 to 225, 231 to 233, 241 to 244 of the film electrode 20 in the upper-lower direction in a state where the film electrode 20, the base 30 and the substrate 40 are assembled in the upper cover 10 and the lower cover 50.

As a result, irradiated light (not illustrated) emitted from the plurality of LEDs 44 transmits through the transparent base 30 and the transparent film electrode 20 (electrodes 22 to 24) to illuminate the operating buttons 131 to 135, 141 to 143, 151 to 154 of the upper cover 10.

Figure 3:
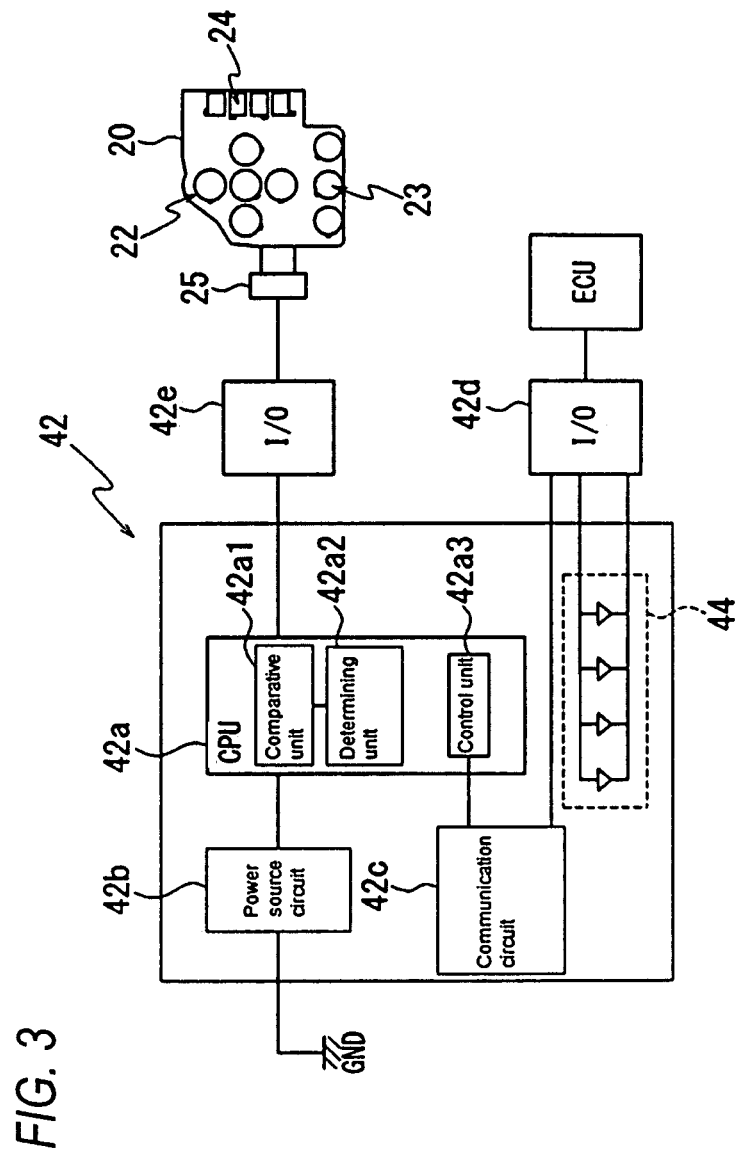
FIG. 3 is a functional block diagram illustrating a control unit according to the embodiment.

FIG. 3 is a functional block diagram of the control unit 42.

The control unit 42 includes a CPU 42a, a power source circuit 42b for supplying drive power to the CPU 42a and the LED 44, a communication circuit 42c for transmitting and receiving signals between the CPU 42a and the ECU (in-vehicle unit for a vehicle), and interface (I/O) circuits 42d, 42e.

The CPU 42a is connected through the interface circuit 42e and the terminal portion 25 to the electrodes 22 to 24 of the film electrode 20, and specifies the operated operating button, and specifies the operation form of each of the operated operating areas 13 to 15 (the operating buttons 131 to 135, 141 to 143, 151 to 154 based upon presence/absence of a change in capacitance of each of the detection electrodes 221 to 225, 231 to 233, 241 to 244 of the electrodes 22 to 24 and a changing amount in capacitance at the time the capacitance has changed.

The CPU 42a includes a comparative unit 42a1, a determining unit 42a2 and a control unit 42a3.

The comparative unit 42a1 of the CPU 42a detects presence/absence of a change in capacitance of each of the detection electrodes 221 to 225, 231 to 233, 241 to 244 of the electrodes 22 to 24 in the film electrode 20, and compares a changing amount in capacitance of each of the detection electrodes 221 to 225, 231 to 233, 241 to 244 in which a change in capacitance has occurred to a threshold to be described later.

The determining unit 42a2 determines an operating button arranged to face the detection electrode having the largest changing amount in capacitance among the detection electrodes in which the capacitance has changed, as the operated operating button. In addition, the determining unit 42a2 specifies by which any of operating forms (touch operation, push operation and slide operation) the operated operating button is operated, based upon how to change in capacitance (refer to FIGS. 4C and 4D, and FIG. 5).

The control unit 42a3 is connected through the communication circuit 42c and the interface circuit 42d to the ECU (in-vehicle unit), and performs control of the ECU based upon the specified result of the operated operating button and the operation form by the determining unit 42a2.

For example, the control unit 42a3, when it is determined that the operating button 133 is operated in the form of the touch operation, transmits a command of indicating that the touch operation is performed on the operating button 133 through the communication circuit 42c to the ECU.

Lighting-on/lighting-out of the LED 44 is performed based upon a control signal received from the ECU disposed in the vehicle side. For example, at night the ECU disposed in the vehicle side transmits a control signal for indicating lighting-on of all the plurality of LEDs 44 to the LEDs 44 based upon lighting-on of an unillustrated head light for a vehicle. The LEDs 44 light on based upon receiving the control signal for indicating the lighting-on of all the LEDs 44 from the ECU.

Next, an explanation will be made of specifying presence/absence of each operation of the operating buttons 131 to 135, 141 to 143, 151 to 154 in the respective operating areas 13, 14, 15 which will be performed by the control unit 42 (CPU 42a), and specifying the operation form of each operation for the operating buttons.

First, an explanation will be made of specifying the touch operation and the push operation of the operating button.

Figure 4A:
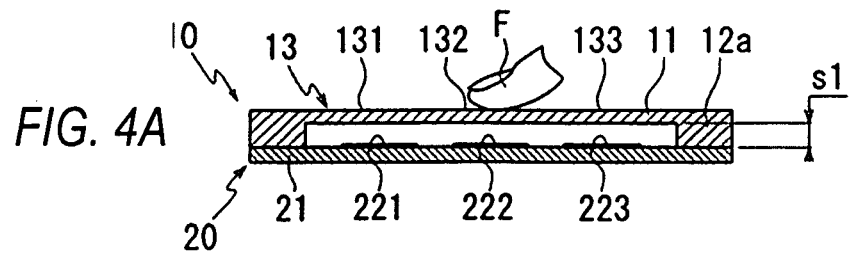
FIGS. 4A to 4D are diagrams explaining a touch operation and a push operation to operating buttons according to the embodiment.
Figure 4B:
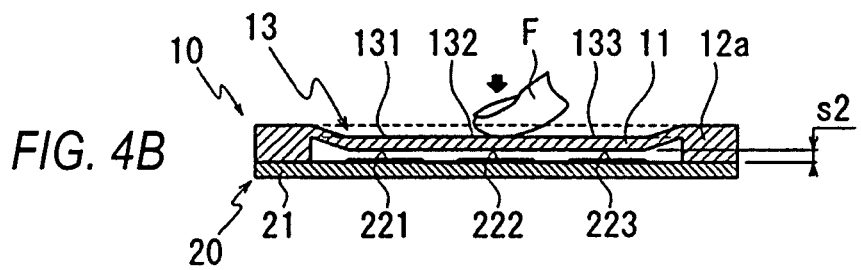
Figure 4C:
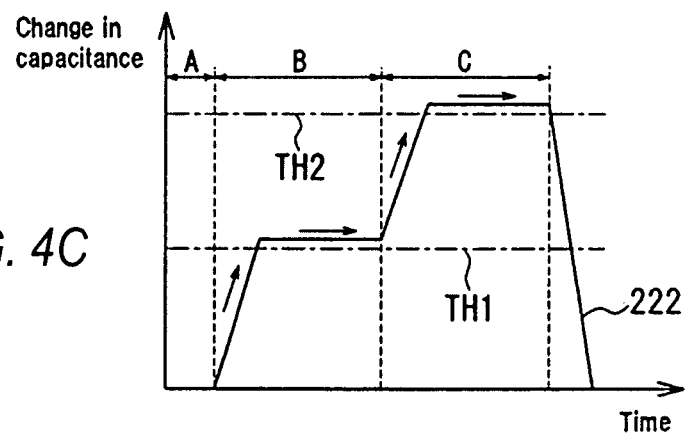
Figure 4D:
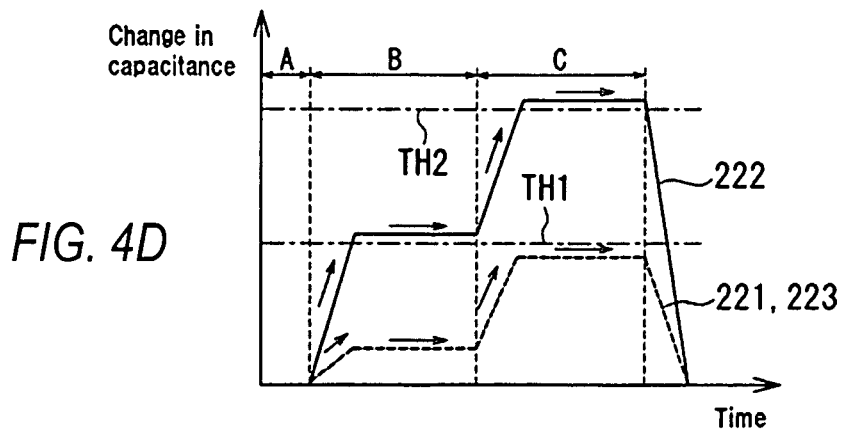

FIG. 4A is a diagram explaining the touch operation of each of the operating buttons 131 to 133, and FIG. 4B is a diagram explaining the push operation of each of the operating buttons 131 to 133. FIG. 4C is a graph explaining a changing amount in capacitance of the detection electrode 222 arranged to face the operating button 132 in FIGS. 4A and 4B, and FIG. 4D is a graph explaining a changing amount in capacitance of the detection electrode 222 arranged to face the operating button 132 in FIGS. 4A and 4B and a changing amount in capacitance of each of the detection electrodes 221, 223 arranged adjacent to the detection electrode 222.

Here, according to the embodiment, the control unit 42 is configured to specify presence/absence of each operation of the operating buttons 131 to 135, 141 to 143, 151 to 154 in the respective operating areas 13, 14, 15, and specify the operation form of the each operation, based upon a change in capacitance of each of the detection electrodes 221 to 225, 231 to 233, 241 to 244 corresponding to the respective operating buttons of the respective operating areas 13, 14, 15 on a one-on-one relationship.

Since the methods for specifying the presence/absence of the respective operations of the operating buttons 131 to 135, 141 to 143, 151 to 154 in the respective operating areas 13, 14, 15 and specifying the respective operation forms in the respective operations are the same with each other, the following explanation will be made of specifying the presence/absence of each operation of the operating buttons 131 to 135 in the operating area 13, and specifying the operation form of the each operation, as a representative thereof.

First, a principle of specifying the operated operating button and the operation form of the operated operating button will be explained.

For example, when the operating button 132 is operated, the capacitance of the detection electrode 222 arranged to face the operating button 132 changes.

Since the control unit 42 monitors presence/absence of a change in capacitance of each of the detection electrodes 221 to 225, when the operating button 132 is operated, the control unit 42 detects a change in capacitance of the detection electrode 222 arranged to face the operating button 132 to specify the operation of the operating button 132.

Here, as illustrated in FIG. 2B, the thickness t1 of the operating portion 12 in the upper wall 11 where the operating area 13 is disposed is thinner than the thickness t2 of the outer edge part 12a (upper wall 11) surrounding the outer edge of the operating portion 12. The thickness t1 of the operating portion 12 is defined such that when the operating area 13 is operated to be pushed downward to the film electrode 20-side, the pushed operation area and the peripheral area are displaced to the film electrode 20-side.

Therefore a changing amount in capacitance in the detection electrode 222 when the push operation is performed on the operating button 132 is larger than a changing amount in capacitance in the detection electrode 222 when the touch operation is performed thereon.

In the embodiment, when the changed capacitance in the detection electrode 222 in which the capacitance has changed is equal to or more than a predetermined first threshold TH1 and is less than a second threshold TH2 larger than the first threshold TH1 (time band B in FIG. 4C), the control unit 42 determines that the operation form of the operating button 132 is the touch operation, and when the changed capacitance in the detection electrode 222 is equal to or more than the second threshold TH2 (time band C in FIG. 4C), the control unit 42 determines that the operation form of the operating button 132 is the push operation.

In this way, based upon a difference in magnitude of capacitance between when the push operation is performed on the operating button 132 and when the touch operation is performed thereon, the operation form of the operating button 132 is specified as any one of the push operation and the touch operation.

Here, in the embodiment, since the respective operating buttons 131 to 135 in the operation area 13 are disposed to be close to each other, not only the capacitance of the detection electrode corresponding to the actually operated operating button but also the capacitance of the detection electrode corresponding to the other operating button adjacent to the operated operating button change.

Therefore in the embodiment, in a case where there is a plurality of detection electrodes in which the capacitance has changed, the actually operated operating button is specified based upon a magnitude of the capacitance of the detection electrode in which the capacitance has changed.

Explaining by taking a case where the operating button 132 is operated as an example, when the changed capacitance in the detection electrode 222 corresponding to the operating button 132 is equal to or more than a predetermined first threshold TH1 and is less than a second threshold TH2 larger than the first threshold TH1, the operation form of the operating button 132 is specified as a touch operation.

In addition, when the changed capacitance in the detection electrode 222 is equal to or more than the second threshold TH2 and the capacitance in each of the other detection electrodes 221, 223, 224, 225 adjacent to the detection electrode 222 also increase, the operation form of the operating button 132 is specified as a push operation.

Here, for specifying the operation form of the operating button as the push operation, (a) a condition that the changed capacitance in the detection electrode 222 is equal to or more than the second threshold TH2 and (b) a condition that the capacitance in each of the other detection electrodes 221, 223, 224, 225 adjacent to the detection electrode 222 also increases are required to be met. The reason for it is to be able to more securely and more accurately detect that the operation form of the operating button is the push operation.

Incidentally in a case where the operating button that is push-operated is the operating button 133 (refer to FIG. 2A), when the changed capacitance in the detection electrode 223 corresponding to the operating button 133 is equal to or more than the second threshold TH2 and the capacitance in the other detection electrode 222 adjacent to the detection electrode 223 also increases, the operating button 133 is specified as the push operation.

Hereinafter, an explanation will be made of an example where, when the operating button 312 is operated, a change in capacitance in the detection electrode 222 corresponding to the operating button 132 and in the detection electrodes 221, 223 corresponding to the other operating buttons 131, 133 adjacent to the operating button 132 each occurs.

In this case, the control unit 42 simultaneously detects a change in capacitance in each of the detection electrodes 221, 222, 223 in which the capacitance has changed (time band B in FIG. 4D). Therefore a changing amount in capacitance in each of the detection electrodes 221, 222, 223 is compared.

Here, since the change amount in capacitance in the detection electrode corresponding to the actually operated operating button is the largest, it is determined that the operating button 132 corresponding to the detection electrode 222 in which the changing amount in capacitance is the largest is operated.

It should be noted that the operation form (the push operation or touch operation) of the operating button 132 is specified based upon a magnitude of the changed capacitance in the same way as in a case in FIG. 4C as described above (time band C in FIG. 4D).

Next, an explanation will be made of specifying a slide operation of an operating button.

Figure 5:
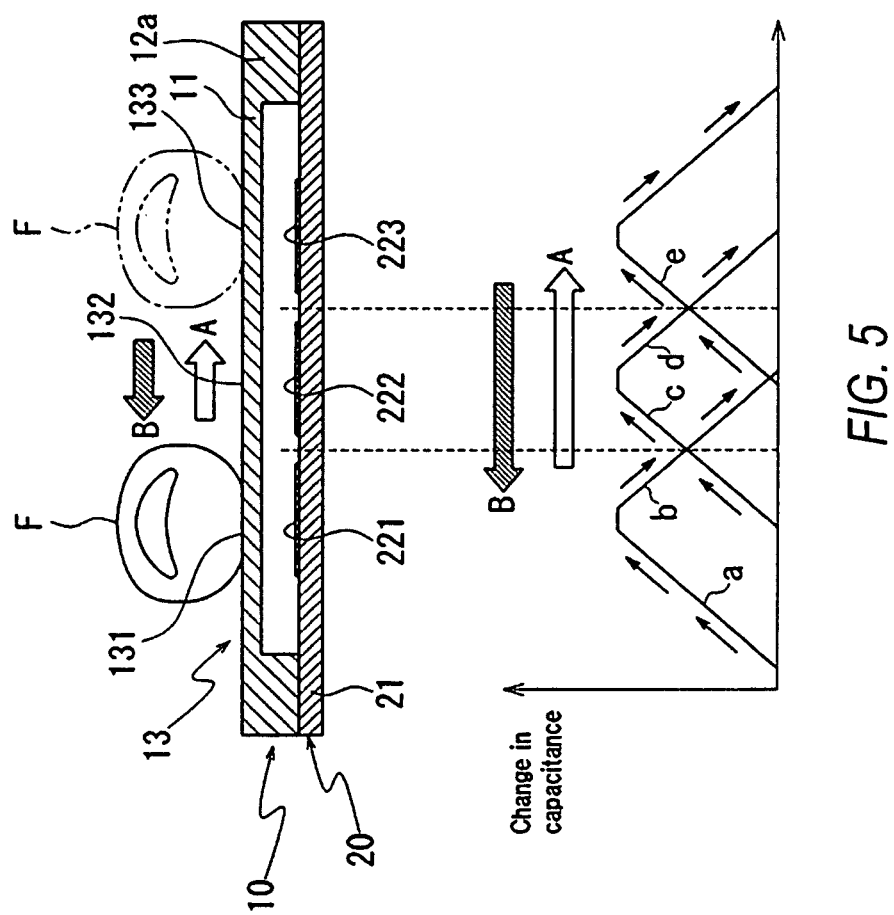
FIG. 5 is a diagram explaining a slide operation to operating buttons according to the embodiment.

FIG. 5 is a diagram explaining the slide operation of the operating button, and is a diagram explaining a change in capacitance of the detection electrodes 221, 222, 223 in a case of sliding a finger F between the operating buttons 131 to 133.

For example, when the finger F of an unillustrated operator performs a slide operation on operating buttons in the operating area 13 in the order of the operating button 131, the operating button 132 and the operating button 133 (arrow A direction) (slide operation A), the capacitance in the detection electrode 221 corresponding to the operating button 131 that the finger F first touches first increases (inclined surface a in FIG. 5).

Then, when the slide operation causes the position that finger F touches to move from the operating button 131 to the operating button 132, the capacitance in the detection electrode 221 corresponding to the operating button 131 decreases (inclined surface b in FIG. 5), and the capacitance in the detection electrode 222 corresponding to the operating button 132 increases (inclined surface c in FIG. 5).

Likewise when the slide operation causes the position that finger F touches to move from the operating button 132 to the operating button 133, the capacitance in the detection electrode 222 corresponding to the operating button 132 decreases (inclined surface d in FIG. 5), and the capacitance in the detection electrode 223 corresponding to the operating button 133 increases (inclined surface e in FIG. 5).

Accordingly in the embodiment the control unit 42 is configured to specify the operation form of the operating button as the slide operation when the detection electrodes 221, 222, 223 in which the capacitance has changed are switched with time, and specify the operating buttons 131, 132, 133 corresponding to the detection electrodes 221, 222, 223 to be slide-operated in the order of the detection electrode the capacitance of which has become the largest.

Accordingly when the finger F of an unillustrated operator performs s slide operation on the operating buttons in the operating area 13 in the order of the operating button 131, the operating button 132 and the operating button 133 (arrow A direction) (slide operation A), since the detection electrodes in which a changing amount in capacitance becomes the largest are switched in the order of the detection electrode 221, the detection electrode 222 and the detection electrode 223, it is possible to specify that the slide operation is performed on the operating buttons in the order of the operating button 131, the operating button 132 and the operating button 133 (arrow A direction).

In addition, when the finger F of an unillustrated operator performs the slide operation on the operating buttons in the operating area 13 in the order of the operating button 133, the operating button 132 and the operating button 131 (arrow B direction) (slide operation B), since the detection electrodes in which a changing amount in capacitance becomes the largest are switched in the order of the detection electrode 223, the detection electrode 222 and the detection electrode 221, it is possible to specify that the slide operation is performed on the operating buttons in the order of the operating button 133, the operating button 132 and the operating button 131 (arrow B direction).

Next, the embodiment will be explained by taking a case of operating an in-vehicle instrument for a vehicle (an air conditioner, audio device or the like) by the switch device 1 as an example.

Figure 6A:
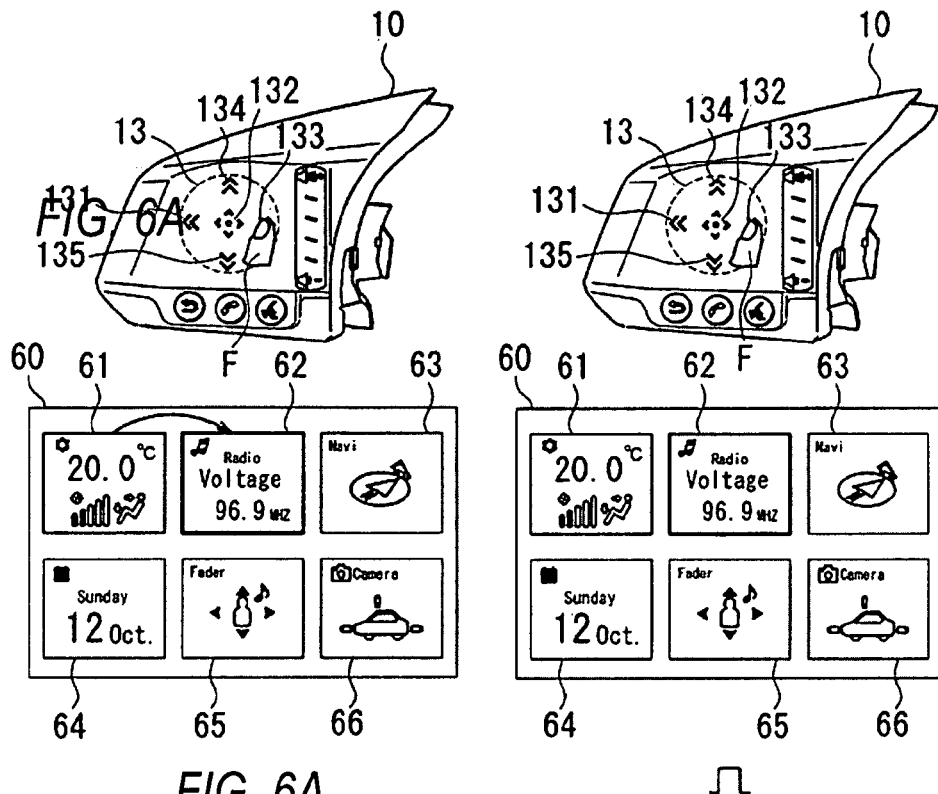
FIGS. 6A and 6B are diagrams explaining operations of the switch device according to the embodiment.
Figure 6B:
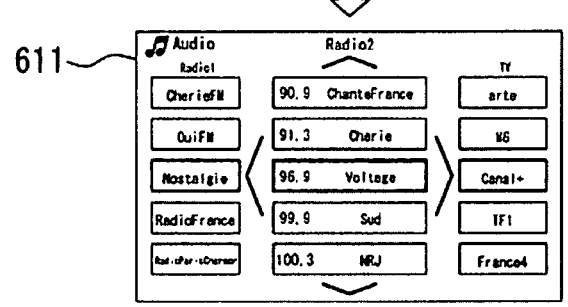

FIGS. 6A and 6B are diagrams explaining an operation of the switch device 1, wherein FIG. 6A illustrates a case where a touch operation is performed on the operating button 133, and FIG. 6B illustrates a case where a push operation is performed on the operating button 133.

A liquid crystal display device 60 is mounted on an unillustrated vehicle, and a state of the in-vehicle instrument for a vehicle is displayed on the liquid crystal display device 60. The operation of the switch device 1 is reflected on the liquid crystal display device 60.

In the embodiment, the liquid crystal display device 60 displays state of "air conditioner 61", "audio device 62", "navigation device 63", "calendar device 64", "mixing (fader) device 65" and "in-vehicle camera device 66" in the order from the left top side to the right direction.

As illustrated in FIG. 6A, when an operator touches the operating button 133 in the operating area 13 with the finger F, the capacitance of the detection electrode 223 arranged to face the operating button 133 increases.

In this case, the capacitance of the detection electrode 222 corresponding to the other operating button 132 adjacent to the operating button 133 also increases, but since a changing amount in capacitance of the detection electrode 223 is larger than a changing amount in capacitance of the detection electrode 222, the operated operating button is specified as the operating button 133.

In addition, when the changed capacitance in the detection electrode 223 is equal to or more than a predetermined first threshold TH1 and is less than a second threshold TH2 larger than the first threshold TH1 (refer to FIG. 4D), it is determined that the operating button 133 arranged to face the detection electrode 223 is operated in the operation form of the touch operation.

Along with it, in the liquid crystal display device 60 a selection display (bold frame in the figure) is moved to the right side, and the selection transfers from "air conditioner 61" first selected to "audio device 62".

Next, as illustrated in FIG. 6B, at the time of pushing the operating button 133 with the finger F in a state where the audio device 62 is selected, the capacitance of the detection electrode 223 increases more than the increase in capacitance in the touch operation.

When the changed capacitance in the detection electrode 223 is equal to or more than the second threshold TH2 (refer to time band C in FIG. 4D), it is determined that the operating button 133 arranged to face the detection electrode 223 is operated in the operation form of the push operation.

Along with it, the selection of "audio device 62" is fixed in the liquid crystal display device 60, and the display transfers to a detail operating screen 611 of the audio device 62 (refer to a lower arrow in FIG. 6B).

On the detail operating screen 611, selection or fixation of various parameters can be performed by the touch operation or the push operation in the same way as the above.

As described above, in the embodiment, (1) There is provided a switch device comprising:
the non-conductive operating portion 12 provided with the
plurality of operating areas 13 to 15 inside the outer edge part 12a of the operating portion 12;
the film electrode 20 (the electrode sheet) that is provided to be spaced from the operating portion 12 and has the plurality of detection electrodes 221 to 225, 231 to 233, 241 to 244 of the electrodes 22 to 24 arranged to face the respective operating buttons 131 to 135, 141 to 143, 151 to 154 in the operating areas 13 to 14 on a one-on-one relationship and
the CPU 42a (detecting unit) that detects the operations of the operating areas 13 to 15, wherein
the inner part of the operating portion 12 positioned inward of the outer edge part 12a is displaceable in the facing direction of the operating areas 13 to 15 and the electrodes 22 to 24, and
the CPU 42a is configured to determine the operated operating area and by which any operation form of the touch operation and the push operation the operated operating area is performed, based upon a position of the electrode a capacitance of which has changed and a changing amount in capacitance of the detection electrode the capacitance of which has changed.

With this configuration, when the touch operation is performed on any of the operating areas 13 to 15 in the operating portion 12, the capacitance between any of the operating buttons 131 to 135, 141 to 143, 151 to 154 of the touch-operated operating area of the operating areas 13 to 15 and any of the detection electrodes 221 to 225, 231 to 233, 241 to 244 of the electrodes 22 to 24 changes, and when the push operation is performed on the operating area, each of the operating areas 13 to 15 having been subjected to the push operation is displaced in a direction of being closer to each of the electrodes 22 to 24 arrange to face it, the width of the interval between the operating area and the detection electrode changes (changes from interval s1 to interval s2). As a result, the capacitance between the push-operated operating area and the detection electrode changes largely more than in a case of the touch operation.

Accordingly, it is possible to specify the operated operating area and by which any form of the touch operation and the push operation the operated operating area is performed, based upon the position of the detection electrode a capacitance of which has changed and a changing amount in capacitance of the detection electrode the capacitance of which has changed. Therefore both the touch operation and the push operation can be detected by the operation of the capacitance type touch switch alone.

(2) The control unit 42 (CPU 42a) is configured to determine that any of the operating buttons 131 to 135, 141 to 143, 151 to 154 in the operating areas 13 to 15 arranged to face any of the detection electrodes 221 to 225, 231 to 233, 241 to 244 in which the changing amount of the capacitance is the largest among any of the detection electrodes 221 to 225, 231 to 233, 241 to 244 of any of the plurality of electrodes 22 to 24 which changes in capacitance in a direction of being large is an operating area operated by any form of the touch operation or the push operation.

With this configuration, by detecting the detection electrode in which the capacitance has changed most largely in the change in capacitance of the detection electrodes 221 to 225, 231 to 233, 241 to 244 of the plurality of electrodes 22 to 24, any of the operating buttons 131 to 135, 141 to 143, 151 to 154 of the operating areas 13 to 15 having subjected to the touch operation or the push operation can be specified.

Accordingly a particular device (for example, mechanical push button switch) for determining any of the operating buttons 131 to 135, 141 to 143, 151 to 154 of the operated operating areas 13 to 15 may be not provided, and costs of the switch device can be reduced by reducing the number of components thereof.

(3) The control unit 42 (CPU 42a) is configured to determine that, when the changed capacitance in any of the detection electrodes 221 to 225, 231 to 233, 241 to 244 of any of the plurality of electrodes 22 to 24 in which the changing amount of the capacitance in a direction of being large is the largest is equal to or more than the predetermined first threshold TH1 and is less than the second threshold TH2 larger than the first threshold TH1, the operation form of the operated operating area is the touch operation, and when the changed capacitance is equal to or more than the second threshold TH2, the operation form of the operated operating area is the push operation.

With this configuration, the determination on the touch operation and the push operation to the operation area can be performed based upon a magnitude of the changed capacitance to the first threshold TH1 and the second threshold TH2 larger than the first threshold TH1. Therefore it is not necessary to use a particular determination device for the determination on the push operation and it is possible to achieve simplification and a low cost of the device.

(4) Particularly, the control unit 42 (CPU 42a) is configured to determine that, when the changed capacitance in any of the detection electrodes 221 to 225, 231 to 233, 241 to 244 of any of the plurality of electrodes 22 to 24 in which the changing amount of the capacitance in a direction of being large is the largest is equal to or more than a second threshold TH2 and when the capacitance in the other electrode adjacent to any of the detection electrodes 221 to 225, 231 to 233, 241 to 244 of any of the electrodes 22 to 24 in which the changing amount of the capacitance is the largest changes also in a direction of being large (in a direction of being closer to the second threshold TH2), it is determined that the operation form of the operated operating area is the push operation.

In a case where a plurality of operating buttons are arranged to be adjacent to each other in the operating portion 12, when an operating button is operated, not only the capacitance of a detection electrode corresponding to the operated operating button but also the capacitance of a detection electrode corresponding to the adjacent other operating button change.

Here, a changing amount of the capacitance in the detection electrode corresponding to the actually operated operating button becomes the largest, and a changing amount of the capacitance in the detection electrode corresponding to the adjacent other operating button becomes the second largest.

Accordingly with this above configuration, for example, when the operating button 132 is operated, based upon (a) a condition that the changed capacitance in the detection electrode 222 is equal to or more than the second threshold TH2 and (b) a condition that the capacitance in each of the other detection electrodes 221, 223, 224, 225 adjacent to the detection electrode 222 also increases, it is possible to determine that the operation form of the operating button is the push operation. Thereby it is possible to more securely and more accurately detect which operating button is subjected to the push operation.

(5) The control unit 42 (CPU 42a) is configured to determine that, when the detection electrode in which a changing amount of the capacitance is the largest is switched with time, the operating area arranged to face the detection electrode in which a changing amount in capacitance is the largest is slide-operated in the order of the switching.

With this configuration, the slide operation of the operating area can be easily specified based upon only the changing amount of the capacitance.

In the aforementioned embodiment, there is exemplified a case where the operating area 13 is formed in a circular shape, but any shape of the operating area 13 may be formed in such a manner that the operating buttons arranged in the operating area 13 can be deflected equally in the vertically downward side (pushing direction), for example, may be in an elliptical shape or in a polygonal shape.

In the aforementioned embodiment, there is exemplified a case where the operating area 13 is formed to be thinner than the other operating portion 12, but the thickness of the operating area 13 may be made such that the pushed operating button can be deflected, for example, only sections of the operating area 13 corresponding to the respective operating buttons may be formed to be thin.

In the aforementioned embodiment, there is exemplified a case where, when the operating button is deflected, the interval s2 between the operating button and the detection electrode arranged to face the operating button is formed, but when the operating button is deflected, a distance between the operating button and the detection electrode may be set to zero.

The arrangement of the operating buttons 131 to 135, 141 to 143, 151 to 154 is not limited to that of the aforementioned embodiment, but various arrangements thereof can be applied.

While only the selected embodiments have been chosen to illustrate the present invention, it will be apparent to those skilled in the art from this disclosure that various changes and modifications can be made therein without departing from the scope of the invention as defined in the appended claims. Furthermore, the foregoing description of the embodiments according to the present invention is provided for illustration only, and not for the purpose of limiting the invention as defined by the appended claims and their equivalents.

What is claimed is:

1. A switch device comprising:

a non-conductive operating portion provided with a plurality of operating areas inside an outer edge part of the operating portion;

an electrode sheet that is provided to be spaced from the operating portion and has a plurality of electrodes arranged to face the respective operating areas on a one-on-one relationship, each electrode including at least one detection electrode; and a detecting unit that detects operations of the plurality of operating areas;

wherein an inner part of the operating portion positioned inward of the outer edge part is displaceable in a facing direction of the operating areas and the electrodes;

wherein the detecting unit is configured to determine an operated operating area, which is operable by any form of a touch operation and a push operation, based upon a position of at least one of the detection electrodes, a change in capacitance of the at least one detection electrode, and a changing amount in capacitance of the at least one detection electrode;

wherein the detecting unit is configured to determine that one of the plurality of operating areas is the operated operating area when a detection electrode having a largest changing amount in capacitance is arranged to face the one of the plurality of operating areas; and wherein the detecting unit is configured to determine that, when the changing amount in capacitance of the detection electrode having the largest changing amount is equal to or more than a predetermined threshold and when a capacitance in a detection electrode adjacent to the detection electrode having the largest changing amount also changes, an operation form of the operated operating area is the push operation.

2. A switch device comprising:

a non-conductive operating portion provided with a plurality of operating areas inside an outer edge part of the operating portion;

an electrode sheet that is provided to be spaced from the operating portion and has a plurality of electrodes arranged to face the respective operating areas on a one-on-one relationship, each electrode including at least one detection electrode; and a detecting unit that detects operations of the plurality of operating areas;

wherein an inner part of the operating portion positioned inward of the outer edge part is displaceable in a facing direction of the operating areas and the electrodes;

wherein the detecting unit is configured to determine an operated operating area, which is operable by any form of a touch operation and a push operation, based upon a position of at least one of the detection electrodes, a change in capacitance of the at least one detection electrode, and a changing amount in capacitance of the at least one detection electrode;

wherein the detecting unit is configured to determine that one of the plurality of operating areas is the operated operating area when a detection electrode having a largest changing amount in capacitance is arranged to face the one of the plurality of operating areas; and wherein the detecting unit is configured to determine that, when the detection electrode having a largest changing amount is switched with time, the operating area facing the detection electrode having the largest changing amount in capacitance is slide-operated in the order of the switching.

3. The switch device according to claim 2, wherein the slide operation is detected based on at least a partially overlapping decrease in changing amount of a first detection electrode having the largest changing amount and an increase in changing amount of a successive detection electrode having the largest changing amount.

* * * * *